(12) United States Patent
Hakvoort et al.

(10) Patent No.: US 10,684,466 B2
(45) Date of Patent: Jun. 16, 2020

(54) MIRROR ARRANGEMENT FOR LITHOGRAPHY EXPOSURE APPARATUS AND OPTICAL SYSTEM COMPRISING MIRROR ARRANGEMENT

(71) Applicant: Carl Zeiss SMT GmbH, Oberkochen (DE)

(72) Inventors: Wouter Bernardus Johannes Hakvoort, Enschede (NL); Richard Petrus Hogervorst, Enschede (NL); Petrus Theodorus Rutgers, Hengelo (NL); Kerstin Hild, Schwaebisch Gmuend (DE); Toralf Gruner, Aalen (DE)

(73) Assignee: CARL ZEISS SMT GMBH, Oberkochen (DE)

( * ) Notice: Subject to any disclaimer, the term of this patent is extended or adjusted under 35 U.S.C. 154(b) by 277 days.

(21) Appl. No.: 15/872,974

(22) Filed: Jan. 16, 2018

(65) Prior Publication Data

US 2018/0164581 A1 Jun. 14, 2018

Related U.S. Application Data

(63) Continuation of application No. PCT/EP2016/065772, filed on Jul. 5, 2016.

(30) Foreign Application Priority Data

Jul. 15, 2015 (DE) .................. 10 2015 213 275

(51) Int. Cl.
*G02B 26/08* (2006.01)
*G21K 1/06* (2006.01)
*G03F 7/20* (2006.01)

(52) U.S. Cl.
CPC ......... *G02B 26/0858* (2013.01); *G03F 7/702* (2013.01); *G03F 7/7015* (2013.01);
(Continued)

(58) Field of Classification Search
CPC .............. G02B 26/0858; G02B 5/0808; G02B 5/0816–0833; G02B 26/06;
(Continued)

(56) References Cited

U.S. PATENT DOCUMENTS 3,904,274 A * 9/1975 Feinleib ................. G02B 26/06
359/295
2012/0140351 A1 6/2012 Mann
(Continued)

FOREIGN PATENT DOCUMENTS

DE 10155711 A1 5/2003
DE 102011077234 A1 12/2012
(Continued)

OTHER PUBLICATIONS

International Search Report and Written Opinion in counterpart International Application No. PCT/EP2016/065772, dated Nov. 30, 2016, 10 pages.
(Continued)

*Primary Examiner* — Kimberly N. Kakalec
(74) *Attorney, Agent, or Firm* — Edell, Shapiro & Finnan, LLC

(57) ABSTRACT

Mirror elements (2*a*, 2*b*) include a substrate (4*a*, 4*b*) and a multilayer arrangement (5*a*, 5*b*). The multilayer arrangement includes a reflective layer system (6*a*, 6*b*) having a radiation entrance surface (7*a*, 7*b*) and a piezoelectric layer (8*a*, 8*b*) arranged between the radiation entrance surface and the substrate. Each mirror element includes an electrode arrangement (9*a*, 9*b*, 9*c*) associated with the piezoelectric layer. A layer thickness (tp) of the piezoelectric layer is
(Continued)

controlled by the electric field generated. An interconnection arrangement (10) electrically interconnects adjacent electrodes of adjacent electrode arrangements. According to one formulation, the interconnection arrangement generates an electric field in a gap region (11) between the adjacent electrodes. According to another, an electric resistance (Ri) of the interconnection arrangement in the gap region is greater than an electric resistance (Rw) of the adjacent electrodes and less than an electric resistance (Rl) of the piezoelectric layers of adjacent electrode arrangements.

19 Claims, 3 Drawing Sheets

(52) U.S. Cl.
CPC ...... *G03F 7/70191* (2013.01); *G03F 7/70316* (2013.01); *G21K 1/062* (2013.01)

(58) Field of Classification Search
CPC . G02B 27/0068; G03F 7/70316; G03F 7/702; G03F 7/70191; G03F 7/7015; G03F 7/70825; G03F 7/70275; G03F 7/20; G21K 1/062
See application file for complete search history.

(56) References Cited

U.S. PATENT DOCUMENTS

| | | |
|---|---|---|
| 2012/0140454 A1 | 6/2012 | Mann |
| 2014/0285783 A1* | 9/2014 | Dinger .................. B82Y 10/00 355/67 |
| 2015/0379389 A1 | 12/2015 | Lee et al. |
| 2016/0209751 A1 | 7/2016 | Gruner et al. |
| 2016/0379730 A1 | 12/2016 | Dinger et al. |

FOREIGN PATENT DOCUMENTS

| | | |
|---|---|---|
| DE | 102013219583 A1 | 4/2015 |
| EP | 1178356 A2 | 2/2002 |
| WO | 2009100856 A1 | 8/2009 |
| WO | 2010118928 A1 | 10/2010 |
| WO | 2011012266 A1 | 2/2011 |
| WO | 2011012267 A1 | 2/2011 |
| WO | 2012126954 A1 | 9/2012 |

OTHER PUBLICATIONS

R.F. Cook et al., "Crack Resistance by Interfacial Bridging: Its Role in Determining Strength Characteristics", J. Mater Res., vol. 2, 1987, pp. 345-356.
Office Action in corresponding German Application 102015213275.7, dated Jun. 10, 2016, along with English Translation.

* cited by examiner

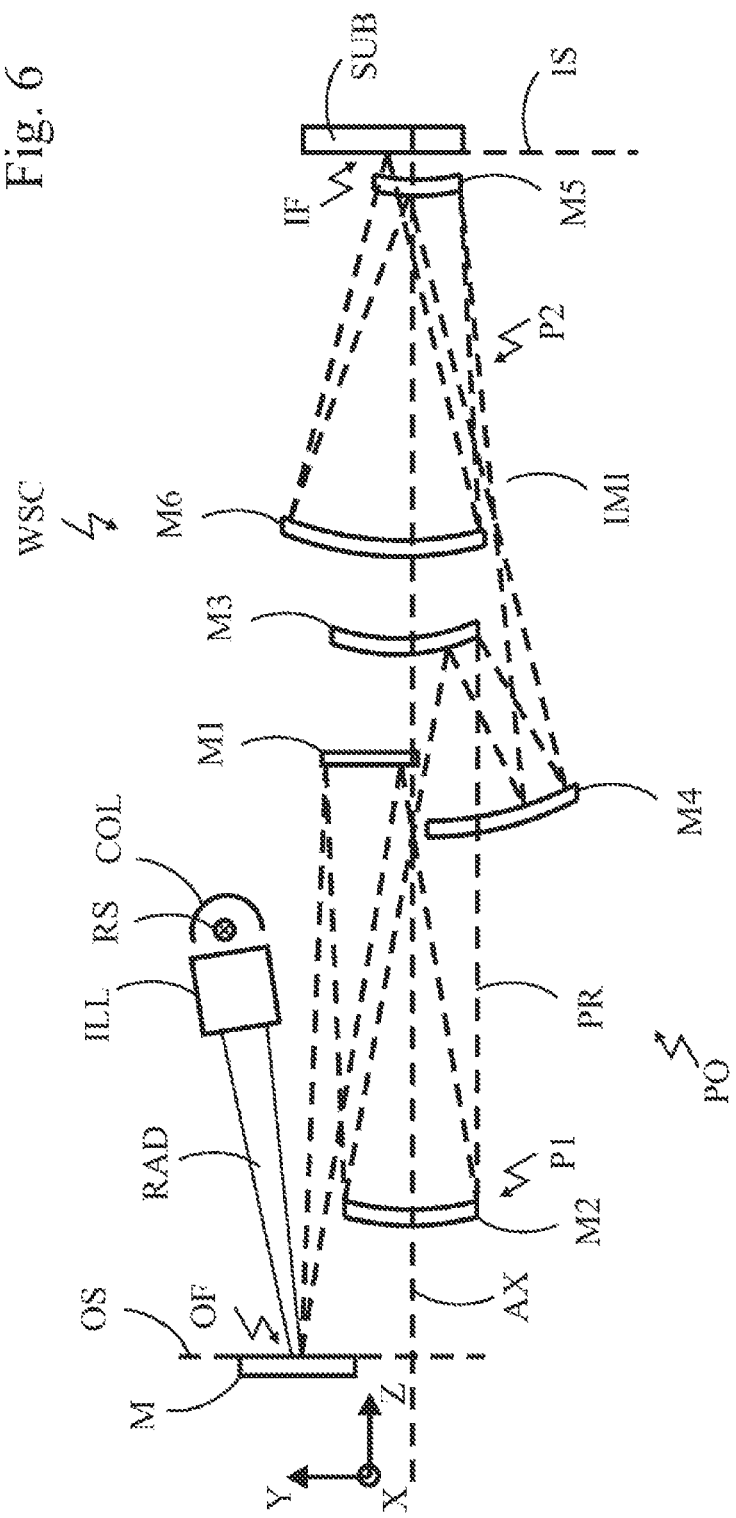

MIRROR ARRANGEMENT FOR LITHOGRAPHY EXPOSURE APPARATUS AND OPTICAL SYSTEM COMPRISING MIRROR ARRANGEMENT

This is a Continuation of International Application PCT/EP2016/065772, which has an international filing date of Jul. 5, 2016, and which claims the priority of the German patent application 10 2015 213 275.7, filed on Jul. 15, 2015. The disclosures of both applications are incorporated herein by reference.

FIELD OF THE INVENTION

The invention relates to a mirror arrangement for a lithography exposure apparatus and to an optical system comprising such a mirror arrangement.

BACKGROUND

Nowadays predominantly lithographic exposure methods are used for producing semiconductor components, e.g. computer chips, and other finely structured components. In this case, use is made of masks (reticles) or other patterning devices which carry or form the pattern of a structure to be imaged, e.g. a line pattern of a layer of a semiconductor component. The pattern is positioned in a lithography exposure apparatus between an illumination system and a projection objective in the region of an object plane of the projection objective and illuminated with an illumination radiation provided by the illumination system. The radiation altered by the pattern passes as projection radiation through the projection objective, which images the pattern onto a substrate to be exposed. A surface of the substrate is positioned in an image plane of the projection objective, which is optically conjugated to the object plane. In general, the substrate surface is coated with a radiation-sensitive layer (resist).

In order to be able to produce even finer structures, various approaches are pursued. By way of example, the resolution capability of a projection objective can be increased by enlarging the image-side numerical aperture of the projection objective. Another approach consists in employing shorter wavelengths of the electromagnetic radiation. For example, optical systems have been developed which use electromagnetic radiation from the extreme ultraviolet range (EUV), in particular having operating wavelengths in the range of between 5 nanometer (nm) and 30 nm.

Radiation from the EUV range cannot be focused or guided with the aid of refractive optical elements, since the short wavelengths are absorbed by the known optical materials that are transparent at longer wavelengths. Therefore, mirror systems are used for EUV lithography. Not only in optical systems used for EUV lithography, but also in optical systems for lithography using light from the deep ultraviolet range (DUV, operating wavelength below 300 nm) or vacuum ultraviolet range (VUV, operating wavelength below 200 nm) mirrors are applied.

In order to ensure a best possible quality of the lithographic imaging, it is generally endeavored to produce a well defined intensity distribution in the illumination field illuminated by the illumination system and to image the pattern of the mask with as little as possible aberrations into the image field. These requirements not only have to be met by an optical system at the time of its delivery, but have to be maintained over the entire lifetime of the optical system without significant change. While in the former case possible deviations are substantially based on design residues and manufacturing faults, changes over the lifetime are often substantially caused by ageing phenomena. One source for deviations is a possible deviation of a mirror surface shape from the specified surface shape, possibly causing relative phase changes within light reflected by the mirror.

Many modern lithography processes use resolution enhancing techniques, such as double exposure, multiple exposure or spacering. These techniques allow generating fine structures through a sequence of subsequent exposure steps. These techniques require that structures generated in subsequent steps should be superimposed with high superimposition accuracy of successive exposures. As a consequence, requirements based on exact lateral image positioning are increased when compared to single exposure techniques.

Further, exact positioning of a focus plane becomes more difficult as the image side numerical aperture NA is increased and wavelengths are reduced. For example, the range of depth of focus is proportional to the wavelength and inversely proportional to the square of the image side numerical aperture. EUV wavelengths at numerical apertures NA larger than 0.4 or wavelengths in the deep ultraviolet range at numerical apertures above 1.1, for example, will reduce the range of depth of focus to values which may be less than 70 nm, for example. As a consequence, the axial position of the focus plane needs to be controlled very precisely.

Further, telecentricity effects may influence the exact positioning of an image relative to the desired image position. Telecentricity may cause the image position to be inclined relative to the propagation direction of the radiation. Therefore, a change in axial position of the exposure area may cause a lateral displacement of the actual image from the desired image position, thereby influencing the lateral superimposition accuracy in a negative way.

In summary, the position of focus in axial as well as lateral position should be controlled very carefully. Further, it should be considered that a real substrate surface, usually coated with a light sensitive coating, may not necessarily be a planar surface, but instead may deviate from planarity. This may require adjustment of focus position between exposure steps or even during a single scanning exposure operation. Further, it would be desirable to be able to control precisely not only the position of focus, but also other factors influencing image quality, such as the imaging scale or aberrations like distortion.

Higher aberrations may be caused by heating of optical elements, which may cause variation of refractive index and/or deformation of optical surfaces. Gravitational forces may also influence the optical effect of optical elements in that these optical surfaces may be deformed due to gravity. Further, aging processes cannot be excluded, which may contribute to aberrations.

Dynamic manipulator systems are frequently employed to account for time-dependent influences on the quality of the lithographic process.

WO 2012/126954 A1 discloses a mirror arrangement for correcting the illumination intensity distribution and the illumination angle distribution in the illumination field of an EUV illumination system. The mirror arrangement comprises a plurality of mirror elements forming a mirror surface, wherein each mirror element has a substrate, on which is applied a multilayer arrangement having a reflective effect with respect to radiation from the EUV range. Each multilayer arrangement includes a piezoelectric layer having a thickness which can be controlled by an electric field generated by an associated electrode arrangement. It is thereby possible for the piezoelectric layers of the mirror elements to be controlled independently of one another and thus to be adjusted with regard to their layer thicknesses individually. As a consequence thereof, the reflection properties of the mirror arrangement can be influenced locally differently over the mirror surface, allowing the correction of the illumination intensity distribution and the illumination angle distribution.

SUMMARY

A problem addressed by the invention is that of providing a mirror arrangement and an optical system equipped therewith which can be used in a lithography exposure apparatus, wherein the mirror arrangement is improved with respect to the prior art and has improved optical properties e.g. for an improved wavefront correction.

For solving this problem, the invention provides mirror arrangements and optical systems as claimed in the independent claims. Advantageous developments are specified in the dependent claims. The wording of all the claims is incorporated by reference into the present description.

The mirror arrangement has a plurality of mirror elements adjacently arranged and jointly forming a mirror surface of the mirror arrangement. Mirror elements can be, in particular laterally, adjacently arranged for example in rows and columns in a manner substantially filling an area of the mirror surface or completely filling the surface area, or else mutually at a distance from one another. The mirror elements may be mirror elements that can be mounted separately from one another and, if appropriate, in a manner separated by interspaces on a carrier structure. The mirror surface may be completely flat (plane mirror) or curved (e.g. convex mirror, concave mirror, cylindrical mirror or general aspherical shape). The mirror elements may be mounted on the carrier structure such that a desired form of the mirror surface is obtained.

Each mirror element comprises a substrate and a multilayer arrangement on the substrate. The multilayer arrangement includes a reflective layer system having a radiation entrance surface, wherein the radiation entrance surface forms a portion of the mirror surface. The reflective layer system comprises one or more reflective layers causing a reflective effect with respect to electromagnetic radiation. Additionally, the reflective layer system may comprise a protection layer on top of the one or more reflective layers. A surface of the topmost layer of the reflective layer system forms the radiation entrance surface. Hence, each mirror element comprises a layer structure including layers essentially parallel to the radiation entrance surface.

Furthermore, the multilayer arrangement of each mirror element includes a piezoelectric layer which is arranged between the radiation entrance surface and the substrate. Each mirror element comprises an electrode arrangement associated with the piezoelectric layer for generating an electric field, wherein a layer thickness of the piezoelectric layer, in a vertical direction normal to the layers, can be controlled by the electric field. The electric field may be generated by applying an electrical voltage to the electrode arrangement. Each electrode arrangement can be driven independently of other electrode arrangements as necessary. It is thereby possible for the piezoelectric layers of the mirror elements to be controlled independently of one another and thus to be adjusted with regard to their layer thicknesses. As a consequence thereof, the reflection properties of the mirror arrangement can be influenced locally differently over the mirror surface, allowing to compensate undesired deviations or changes of the mirror surface.

An electrode of the electrode arrangement may be in touching contact with the piezoelectric layer. It is also possible to arrange one or a plurality of electrodes at a distance from the piezoelectric layer to be influenced, as long as the electric field can permeate the material-filled or material-free interspace to reach the piezoelectric layer. Consequently, one or a plurality of layers of the multilayer arrangement, in particular one or more of the reflective layers of the reflective layer system, may be situated between an electrode and the associated piezoelectric layer.

There are various possibilities for arranging the piezoelectric layer with respect to the one or more reflective layers of the reflective layer system. For example, the piezoelectric layer may be arranged between the reflective layer system and the substrate. In this case, the reflective layer system can be raised or lowered with the aid of the piezoelectric layer with respect to the substrate as a whole. By changing relative heights of the reflective layer systems of the adjacently arranged mirror elements a possible unflatness of the mirror surface can be compensated and a spatially resolving phase correction of the wavefront of impinging radiation is possible. In this case, the lateral resolution (spatial resolution) of the correction is dependent on the lateral dimensions of the radiation entrance surfaces of the individual mirror elements.

According to one formulation of the claimed invention the mirror arrangement comprises an interconnection arrangement electrically interconnecting adjacent first and second electrodes of adjacent electrode arrangements. The first electrode is separated from an adjacent electrode, the second electrode, in a lateral direction by a gap region at least on one side of the piezoelectric layer. Because of the gap between the first and second electrodes, there is no short circuit between the first and second electrodes and hence the adjacent electrode arrangements can be driven independently of one another.

According to one formulation the interconnection arrangement generates an interconnection electric field in the gap region between the first and second electrodes. The interconnection electric field generates a continuous transition between a first electric field at the first electrode and a second electric field at the second electrode.

According to another formulation an electric resistance of the interconnection arrangement in the gap region between the first and second electrodes is greater than an electric resistance of the first and second electrodes and less than an electric resistance of the piezoelectric layers of the adjacent electrode arrangements comprising the first and second electrodes.

The electric resistance of the first and second electrodes may include possible electric resistances of lead-in connection wires connecting the first and second electrodes with corresponding voltage sources and/or current sources. Since the electric resistance of the interconnection arrangement, also denoted as an "interconnection resistance", is greater than the electric resistance of the first and second electrodes, also denoted as an "electrode resistance", there will be no short circuit between the first and second electrodes. The first and second electrode arrangements can be driven independently of one another. Since the interconnection resistance is less than the electric resistance of the piezoelectric layer, also denoted as a "piezoelectric resistance", of the adjacent electrode arrangements comprising the first and second electrodes, electric charge provided by the first and second electrodes can accumulate in the interconnection arrangement and will not instantly drain off by leakage through the piezoelectric layers of the adjacent electrode arrangements. When charge is accumulated, the interconnection electric field mentioned above builts up.

Advantageously, the continuous or smooth transition of electric field strength in the piezoelectric material in the gap region from the first electric field, which ends at a boundary of the first electrode, to the second electric field, which starts at a boundary of the second electrode, reduces a risk of material fatigue and cracking of the components of the mirror elements, in particular the piezoelectric layers.

The mirror elements may be arranged in a manner completely filling the area of the mirror surface of the mirror arrangement, wherein lateral boundaries of adjacent mirror elements touch each other. In particular, adjacent piezoelectric layers may touch each other. In this case, the first and second electrodes may not completely cover the corresponding piezoelectric layers in a lateral direction, such that a gap is present between the first and second electrodes so that the first and second electrodes do not touch each other. Otherwise a short circuit may result between them, preventing driving the first and second electrode arrangements independently of one another. Uncovered parts of the piezoelectric layers were not deformed in conventional mirrors, usually resulting in sharp kinks, steps or trenches in parts of the reflective layer systems above the uncovered parts of the piezoelectric layers. Such kinks, steps or trenches in the reflective layer systems may negatively influence a desired wavefront correction. As opposed to that, the interconnection arrangement covers at least the parts of the piezoelectric layers not being covered by the first and second electrodes, and the interconnection electric field generated by the interconnection arrangement causes a deformation of these parts of the piezoelectric layers. Thereby, sources for wavefront errors caused by discrete first and second electrodes, such as sharp kinks, steps or trenches in the reflective layer systems and the mirror surface, are reduced.

An additional advantage of the interconnection arrangement is that it works as a shield for the piezoelectric layers against electric fields, e.g. caused by the lead-in connection wires, from above or below the interconnection arrangement. Therefore it eliminates crosstalk introduced from such electric fields.

In an embodiment of the invention the electric resistance of the interconnection arrangement in the gap region between the first and second electrodes is in the range from 1 kiloohm (k$\Omega$) to 10 megaohm (M$\Omega$), preferably in the range from 10 k$\Omega$ to 1 M$\Omega$.

According to another formulation the electrical conductivity of the interconnection arrangement in the gap region between the first and second electrodes may be in a range from 200 to 1 S/m, particularly in a range from 100 to 1 S/m.

If the interconnection resistance is too high (or the electrical conductivity too low), a time constant for accumulating charge in the interconnection arrangement may be too high. On the other hand, if the interconnection resistance is too low (or the electrical conductivity too high, an electric current flow that is used to maintain the applied electric voltages may cause resistive heating. In an embodiment of the invention the interconnection arrangement comprises a semiconductor material. Typically, the electrode arrangements comprise a metal material. The metal material has a lower specific electric resistivity than the semiconductor material and the semiconductor material has a lower specific electric resistivity than a piezoelectric material. Hence, the interconnection resistance can be higher than the electrode resistance and lower than the piezoelectric resistance. The semiconductor material may be based on silicon or may essentially consist of silicon only. The semiconductor material may be doped, wherein doping allows an adjustment of the resistivity, respectively the resistance, of the interconnection arrangement.

The semiconductor material may be based on materials other than Silicon. For example, the semiconductor material may be selected from a group consisting of: $LaNiO_3$; $SrRuO_3$; $SrVO_3$; $LaCoO_3$; $SrCoO_3$; $LaMnO_3$; $Sr_{0.7}Ce_{0.3}MnO_3$; $La_2Ce_2O_7$; $LaVO_3$; $LaCrO_3$; $LaFeO_3$; $LaTiO_3$; $LaCuO_3$; $La(Mn_{0.5}Co_{0.5})O_3$; $LaCu_{0.4}(Mn_{0.5}Co_{0.5})_{0.6}O_3$; $La_{0.7}Sr_{0.3}FeO_3$; $La_{0.7}Sr_{0.3}MnO_3$; $SrFeO_3$; $BaMnO_3$; $SrMnO_3$; $Ba_{0.5}Sr_{0.5}MnO_3$; $BaRuO_3$; $BaTiO_3$; $CaMnO_3$; $Ce_{0.8}Y_{0.2}O_{1.9}$; MgO; $NdNiO_3$; Y stabilized $ZrO_2$; $ZnFeO_3$; $CaRuO_3$; $CaTiO_3$; $TiO_2$; $La_{0.6}Sr_{0.4}Fe_{0.8}Co_{0.203}$; $La_{0.85}Sr_{0.15}MnO_3$ Normally the resistance of the semiconductor material will strongly depend on temperature, while the resistance of the metal material will be less dependent on temperature. Hence, a resistance measurement of the interconnection arrangement comprising the semiconductor material can be used to determine a local temperature distribution within the mirror arrangement, which may be caused by absorption of impinging radiation within the mirror arrangement. Measuring the temperature distribution provides an estimation of a source for wavefront errors and thus may be used as a feedback-signal for the mirror arrangement, i.e. the individual adjustment of the particular electrical voltages applied to the corresponding electrode arrangements.

In an embodiment of the invention the electric resistance of the first and second electrodes is less than or equal to 1 k$\Omega$, preferably below 100$\Omega$. Hence, there should be no significant voltage drop along the first and second electrodes, in particular along their lead-in connection wires.

In an embodiment of the invention the electric resistance of the piezoelectric layers of the adjacent electrode arrangements with the first and second electrodes is greater than or equal to 10 M$\Omega$, preferably greater than 100 M$\Omega$. Hence, leakage currents through the piezoelectric layers possibly leading to a reduction of electric charge accumulated in the interconnection arrangement can be suppressed.

The interconnection arrangement may comprise interconnection layers interconnecting the first and second electrodes by extending from the boundaries of the first electrodes to the boundaries of the second electrodes. In some embodiments of the invention several parts of the mirror arrangement extend over multiple or all mirror elements, which may simplify fabrication of the mirror arrangement, in particular of the mirror elements.

For example, the interconnection arrangement may comprise a common interconnection layer interconnecting multiple or all mirror elements. The common interconnection layer may not only interconnect the first and second electrodes, but it may extend beyond the boundaries of the first and second electrodes below or above them. Preferably, the common interconnection layer is a continuous layer without any gap, preferably covering an area as large as the mirror surface area. Hence, the common interconnection layer does not have to be structured at all during fabrication, e.g. by a lithography process.

It is also possible, that the piezoelectric layers of multiple or all mirror elements form a common piezoelectric layer and/or the reflective layer systems of multiple or all mirror elements form a common reflective layer system. The common piezoelectric layer without any gap can be continuously deformed and may or may not have discontinuities like kinks, steps or trenches. Similarly, a common reflective layer system without any gap can be continuously deformed and may or may not have discontinuities like kinks, steps or trenches, especially when being deformed by the common piezoelectric layer.

The electrodes of the electrode arrangements of multiple or all of mirror elements opposite to the first and second electrodes may form a common electrode. Hence, not all electrodes need to be connected by individual lead-in connection wires to corresponding voltage sources and/or current sources, but only one common individual lead-in connection wire might be sufficient. Furthermore, only the first and the second electrodes have to be structured with gaps in between them.

The substrates of multiple or all mirror elements may form a common substrate. Thereby, the fabrication of the mirror arrangement, in particular of the layers mentioned above in this paragraph, may take place on the common substrate. Then only the common substrate needs to be mounted on the carrier structure.

In an embodiment of the invention the reflective layer system is adapted for reflecting electromagnetic radiation in a wavelength range below 300 nm, preferably below 200 nm, in particular below 20 nm. A wavelength below 300 nm, like the 248 nm wavelength of a KrF excimer laser, is in the DUV regime. A wavelength below 200 nm, like the 193 nm wavelength of a ArF excimer laser, is in the VUV regime. A wavelength below 20 nm, like the 13.5 nm wavelength e.g. of a gas discharge produced plasma or of a laser-produced plasma, is in the EUV regime. By being adapted to these short wavelength ranges, the mirror arrangement may be applied in a lithography exposure apparatus for very fine structures.

A dielectric enhanced aluminum mirror layer, for example, can reflect electromagnetic radiation from the DUV regime or the VUV regime.

In an embodiment of the invention the reflective layer system comprises a plurality of layer pairs having alternating layers of a high refractive index layer material and a (relative thereto) low refractive index layer material. Such layer pairs are also referred to as a "double layer" or "bilayer". A layer arrangement having a large number of layer pairs acts in the manner of a "Distributed Bragg Reflector". In this case, e.g. for EUV radiation, the reflective layer system simulates a crystal whose lattice planes leading to Bragg reflection are formed by the layers of the material having the lower real part of the refractive index. The optimum period thickness of the layer pairs is determined by the Bragg equation for a predetermined wavelength and for a predetermined angle of incidence (range). For EUV radiation the optimum period thickness is generally between 1 nm and 10 nm. A layer pair can also have, in addition to the two layers composed of relatively high refractive index and relatively low refractive index material, respectively, one or a plurality of further layers, for example an interposed barrier layer for reducing interdiffusion between adjacent layers.

In this case, the piezoelectric layer may be positioned between a first group of layer pairs remote from the substrate and a second group of layer pairs near the substrate. Via the interposed piezoelectric layer, the distance between the layer groups (measured perpendicularly to the radiation entrance surface) can be altered by applying an external voltage. The interposed piezoelectric layer introduces an optical path length difference or a phase shift between the portions of radiation reflected at the first layer group and the portions of radiation reflected at the second layer group. By applying the external voltage, it is possible for the extent of the phase shift to be varied in a continuously variable manner, thereby changing the reflectivity of the corresponding mirror element. The piezoelectric layer integrated between the first and second layer groups acts in the manner of an integrated Fabry-Perot interferometer (etalons) with an electrically adjustable distance between its interfaces having a reflective effect.

A multilayer arrangement can also have more than one piezoelectric layer which is arranged between two adjacent layer groups having a plurality of layer pairs and which serves for the controllable phase shift between the reflected portions of radiation of these layer groups. By way of example, two or three of such piezoelectric layers can be provided, between which layer groups having a plurality of layer pairs are then likewise situated.

The multilayer arrangement may have a plurality of piezoelectric layers, such that a variation of the period thickness within the reflective layer system is possible. Since, for a given operating wavelength and a given angle of incidence, only specific layer periods lead to full constructive interference and hence to a maximum degree of reflection, by varying the period thickness it is possible to alter the reflectivity of the reflective layer system of the mirror element at the operating wavelength in a continuously variable manner. Furthermore, the phase of the reflected radiation is influenced, such that a spatially resolving wavefront influencing is also possible.

For further possibilities concerning layer structures of multilayer arrangements, in particular the reflective layer system and the piezoelectric layer, reference is made to the content of WO 2012/126954 A1. The respective disclosure is incorporated herein by reference.

In an embodiment of the invention a thickness of an interconnection layer of the interconnection arrangement is in the range from 50 nm to 200 nm or even up to 500 nm. Typically the piezoelectric layer will have a surface roughness, which may affect an interconnection layer with a thickness below 50 nm, such that the interconnection layer is not continuous, but has gaps. A thickness in the claimed range may reduce problems originating from surface roughness.

In an embodiment of the invention a maximum electrode diameter of the first and second electrodes, measured parallel to the mirror surface, is in a range from 0.5 mm to 50 mm, particularly in the range from 2 mm to 20 millimeter. A definition of the maximum electrode diameter depends on the form of the first and second electrodes in a plane parallel to the mirror surface. In the case of an electrode with the form of a circle, the diameter may be a diameter of the circle. In the case of a polygonal electrode form, in particular a quadrilateral or hexagonal shape, the diameter may be a longest diagonal in the polygon.

Alternatively or in addition, a width of the gap region between the first and second electrodes may be in a range from 10 mm to 1 mm. The width of the gap region may be determined as the shortest distance of a boundary of the first electrode to an opposite boundary of the second electrode. For the maximum electrode diameter and the width of the gap region, respectively, in the claimed ranges it is possible to approximate the form of the mirror surface to a desired form of the mirror surface, while not having too many electrodes and thereby too many mirror elements, respectively. A number of the mirror elements may be approximately 200 or less. In particular a number of mirror elements over a diameter of a useful area of the mirror arrangement, e.g. the mirror surface, may be in the range from 50 to 180, preferably in the range from 100 to 150, for example.

The invention also relates to an optical system comprising at least one mirror arrangement. The optical system can be a projection objective of a lithography exposure apparatus The mirror arrangement may be arranged in a region of a pupil plane of the projection objective, that is to say in the region of a plane which is situated in the manner Fourier-transformed with respect to the plane of the object surface and the image surface. Other potentially useful positions for a mirror arrangement may be positioned close to a field surface, such as the object surface, the image surface or, if available, a position where a real intermediate image is formed. Two or more mirror arrangements may be provided, preferably at optically different positions.

These and further features emerge not only from the claims but also from the description and the drawings, wherein the individual features can be realized in each case by themselves or as a plurality in the form of sub combinations in an embodiment of the invention and in other fields and can constitute advantageous and inherently protectable embodiments. Exemplary embodiments are illustrated in the drawings and are explained in greater detail below.

BRIEF DESCRIPTION OF THE DRAWINGS

FIG. 6 shows a projection objective of a lithography exposure apparatus comprising embodiments of mirror arrangements.

DETAILED DESCRIPTION

Figure 1:
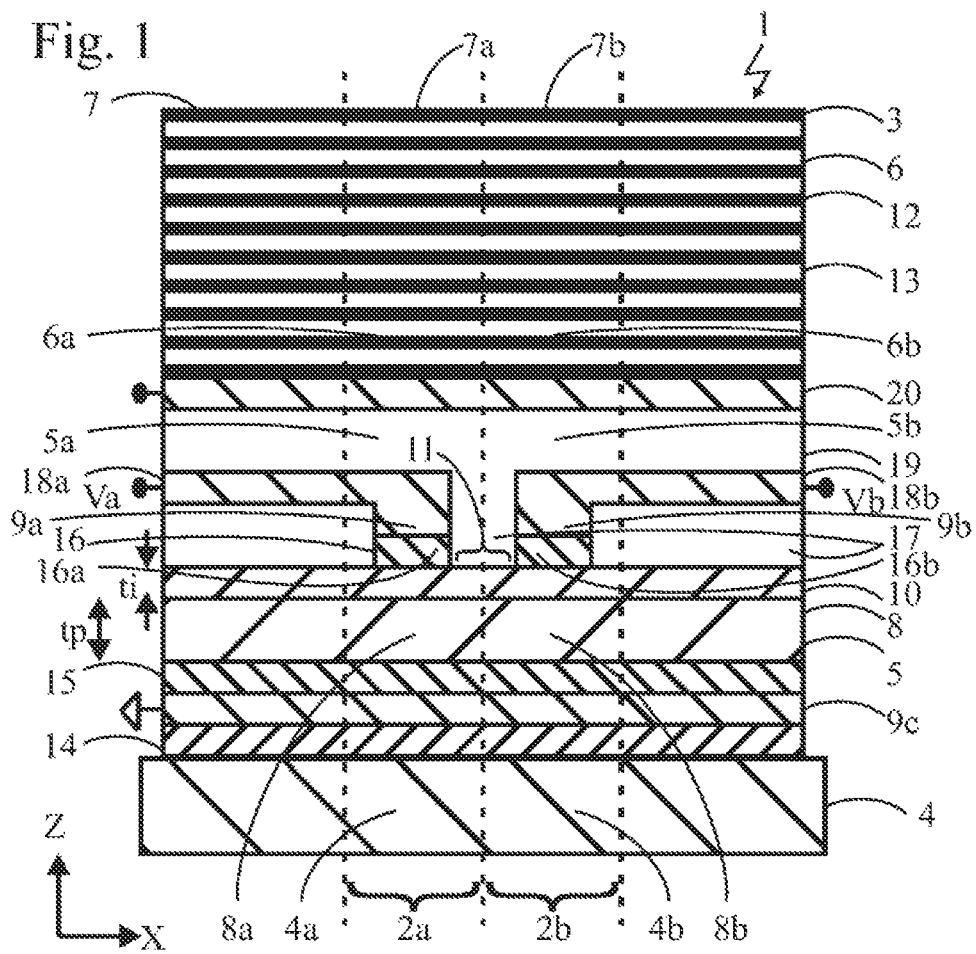
FIG. 1 shows schematically a longitudinal cut through a partial section of an embodiment of a mirror arrangement.

FIG. 1 shows a partial section of a mirror arrangement 1, which has a plurality of mirror elements 2a, 2b. As shown in the cross section of a mirror arrangement in FIG. 2, the plurality of mirror elements 2a, 2b may be adjacently arranged in a hexagonal manner Each mirror element 2a, 2b can be designated as an individual mirror and has a hexagonal cross section.

The mirror arrangement 1 of FIG. 1 comprises a common substrate 4 as a mechanical support. The term "common substrate" as used herein means that one single substrate is common to a plurality or all mirror elements so that the mirror elements share the common substrate. The substrate 4 could be laterally subdivided in individual substrates 4a, 4b of the individual mirror elements 2a, 2b as indicated in FIG. 1. The common substrate 4 provides stiffness against bending by stresses in layers deposited on the common substrate 4. After finishing the mirror arrangement 1 only the common substrate 4 has to be mounted on a carrier structure not shown. The common substrate 4 may be a ultra-low expansion substrate, for example, consisting of an amorphous material like glass having a ultra-low expansion coefficient and a thickness of approximately 50 mm (millimeter) in a vertical z direction.

On a surface of the common substrate 4 multilayer arrangements 5a, 5b of the individual mirror elements 2a, 2b are processed by suitable coating technology, whereby in the case of the example several layers of the multilayer arrangements of the individual mirror elements 2a, 2b form common layers, i.e. layers extending across a plurality of adjacent mirror elements. For producing some or all of the individual layers, it is possible to use e.g. magnetron sputtering, electron beam sputtering or ion beam sputtering or gas flow sputtering. If a crystalline layer structure is desired, it is also possible to effect coating through pulsed layer deposition (PLD), for example.

A first common adhesion layer 14 is deposited on the surface of the common substrate. The first common adhesion layer 14 provides transition from the common substrate 4 to crystalline layers above. It may, for example, consist of $TiO_2$ and have a thickness of approximately 10 nm (nanometer) to 20 nm in the vertical z direction.

On the common adhesion layer 14, a common electrode 9c is deposited, for example by PLD. The common electrode 9c may, for example, consist of Pt and have a thickness from 50 nm to 100 nm in the vertical z direction. Alternatively, for example, some other electrically conductive material, such as Al or Cr, can be used. In the case of the example, the common electrode 9c is electrically connected to one pole of a settable DC voltage source, e.g. to earth ground, not shown.

A second common adhesion layer 15 is deposited on top of the common electrode 9c. The second common adhesion layer 15 forms a conductive layer on which typical piezoelectric materials can be grown, which likewise form a crystalline layer. It may, for example, consist of $LaNiO_3$ and have a thickness from 20 nm to 50 nm in the vertical z direction.

On a surface of the second common adhesion layer 15 a common piezoelectric layer 8 is grown, for example by PLD. The term "common piezoelectric layer" as used herein means that one single piezoelectric layer is common to a plurality or all mirror elements so that the mirror elements share the common piezoelectric layer. The piezoelectric layer 8 could be laterally subdivided in individual piezoelectric layers 8a, 8b of the individual mirror elements 2a, 2b as indicated in FIG. 1. The common piezoelectric layer 8 can consist of a material having a perovskite structure which exhibits a relatively strong piezoelectric effect. In particular, the piezoelectric layer material can be selected from the group consisting of: $Ba(Sr,Zr)TiO_3$, $Bi(Al,Fe)O_3$, $(Bi,Ga)O_3$, $(Bi,Sc)O_3$, CdS, $(Li,Na, K)(Nb,Ta)O_3$, $Pb(Cd, Co,Fe,In,Mg,Ni,Sc,Yb,Zn,Zr) (Nb,W,Ta,Ti)O_3$, ZnO, ZnS, AlScN or may contain at least one material of this group in combination with at least one other material. In this case, the notation (A,B) denotes that an element or ion of the type A or an element or ion of type B can be present in a specific lattice position of the crystal structure. For example, $PbZrTiO_3$ may be selected as the piezoelectric material. The common piezoelectric layer 8 may, for example, have a thickness tp from 1 µm to 4 µm (micrometer) in the vertical z direction. Piezoelectric constants ($d_{33}$) in the range of 65-250 µm/V are known for typical piezoelectric layer materials.

An interconnection arrangement in form of a common interconnection layer 10 is deposited directly on a surface of the common piezoelectric layer 8. The common interconnection layer 10 can, for example, consist of a semiconductor material. The semiconductor material may be based on silicon or may essentially consist of silicon only. The semiconductor material may be doped, wherein doping allows an adjustment of a electrical conductivity, respectively a resistance, of the common interconnection layer 10. A thickness ti of the common interconnection layer 10 is, for example, in the range from 50 nm to 200 nm. A thickness in the mentioned range may reduce problems originating from a surface roughness of the common piezoelectric layer 8.

A structured third adhesion layer 16 is deposited on the common interconnection layer 10. The third adhesion layer 16 is structured using lithography processes into bonding pads 16a, 16b of the individual mirror elements 2a, 2b, such that they are arranged only underneath intended electrodes. The third adhesion layer 16 may, for example, consist of $LaNiO_3$ and have a thickness from 20 nm to 50 nm in the vertical z direction. A third adhesion layer may or may not be present.

Other structuring techniques, such as deposition through a mask or laser ablation may be used to make structured layers.

Figure 2:
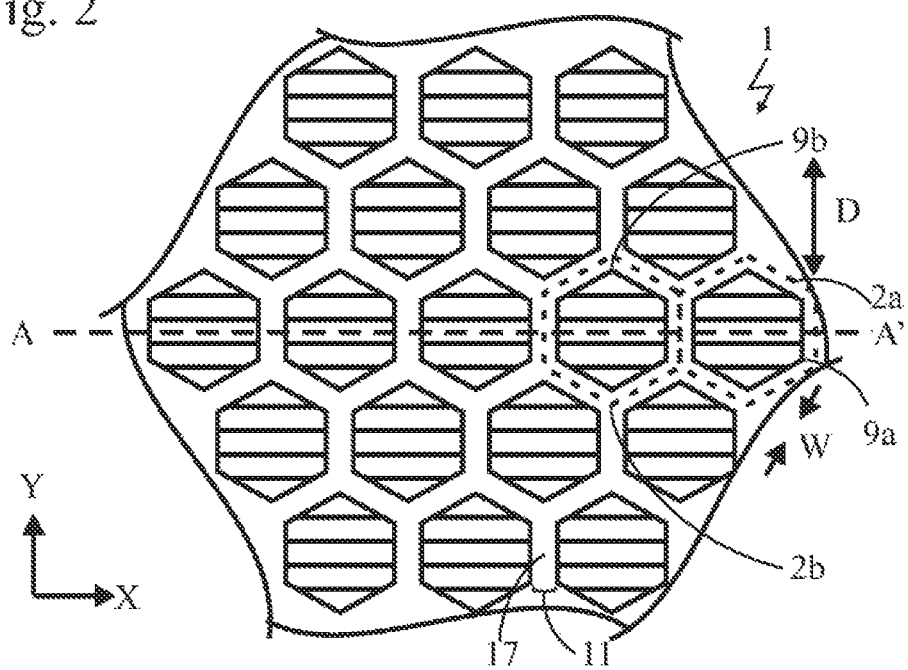
FIG. 2 shows schematically a cross section through a partial section of a mirror arrangement at a height corresponding to the top of first and second electrodes in FIG. 1.

On top of the adhesion pads 16a, 16b each individual mirror element 2a, 2b comprises structured electrodes 9a, 9b, also denoted here as first and second electrodes. The first and second electrodes 9a, 9b may be applied by PLD and are structured using lithography processes. The first and second electrodes 9a, 9b may, for example, consist of similar materials and have a similar thickness as the common electrode 9c. The first electrode 9a and an opposite lateral section of the common electrode 9c below the first electrode 9a form a first electrode arrangement. Correspondingly, the second electrode 9b and the part of the common electrode 9c situated on the opposite side (beyond the piezoelectric layer 8) form a second electrode arrangement. The first and second electrodes 9a, 9b do not completely cover the corresponding individual piezoelectric layers 8a, 8b in a lateral direction, as visible in FIG. 2 as well. A gap or a gap region 11 is present between the first and second electrodes so that the first and second electrodes do not touch each other. Otherwise a short circuit may result between them, preventing driving the first and second electrode arrangements independently of one another. Depending on the arrangement and/or the form of the mirror elements 2a, 2b a cross section of the first and second electrodes 9a, 9b in a lateral plane may be formed. In the case of the example, the first and second electrodes 9a, 9b have a hexagonal cross sectional shape, as shown in FIG. 2. A maximum electrode diameter D of the first and second electrodes 9a, 9b, a longest diagonal in the hexagons, is approximately 5 millimeter in the case of the example. A width W of the gap region 11 between the first and second electrodes, the shortest distance of a boundary of the first electrode 9a to an opposite boundary of the second electrode 9b, is approximately 20 millimeter in the case of the example.

An isolator and spacer layer 17 is deposited laterally beside the adhesion pads 16a, 16b and the first and second electrodes 9a, 9b. The isolator and spacer layer 17 electrically insulates the first and second electrodes 9a, 9b and the adhesion pads 16a, 16b, respectively, from one another. The isolator and spacer layer 17 may, for example, consist of $SiO_2$ and be as high as the adhesion pads 16a, 16b plus the first and second electrodes 9a, 9b.

Each of the first and second electrodes 9a, 9b is connected to the other pole of the DC voltage source via a separate structured lead-in connection wire 18a, 18b. The structured wires 18a, 18b may, for example, consist of similar materials and have a thickness similar to the one of the common electrode 9c. The structured wires 18a, 18b are isolated by the isolator and spacer layer 17 from the common interconnection layer 10 and the common piezoelectric layer 8, respectively. The structured wires 18a, 18b may cross other first and second electrodes, whereby there may be an extra isolator layer in between in order to avoid short circuits.

A common smoothing layer 19 is deposited on top of the structured wires 18a, 18b and the isolator and spacer layer 17. This layer can be polished smooth with an ion beam before the next layer is applied to obtain a sub-nm RMS-flatness (root mean square). The common smoothing layer 19 may, for example, consist of $SiO_2$ and may have a thickness from 2 μm to 10 μm in the vertical z direction.

A common shielding layer 20 is deposited on the common smoothing layer 19, for example, by PLD. The common shielding layer 20 provides electrical shielding between the first and second electrodes 9a, 9b with the wires 18a, 18b and layers deposited on the common smoothing layer 19. Further, the smoothing layer is prevented from getting attacked by EUV photons, whereby degradation is suppressed. In some cases, the common shielding layer 20 may be omitted.

A common reflective layer system 6 is deposited on top of the common shielding layer 20. The term "common reflective layer system" as used herein means that one single reflective layer system is common to a plurality or all mirror elements so that the mirror elements share the common reflective layer system. The reflective layer system 6 could be laterally subdivided in individual reflective layer systems 6a, 6b of the individual mirror elements 2a, 2b as indicated in FIG. 1. The common reflective layer system 6 comprises a plurality of layer pairs having alternating layers 12, 13 of a high refractive index layer material (also called "spacer") and a (relative thereto) low refractive index layer material (also called "absorber"). Such layer pairs are also referred to as a "double layer" or "bilayer". The reflective layer system 6 acts in the manner of a "Distributed Bragg Reflector". In the exemplary embodiment, the common reflective layer system 6 is adapted for reflecting EUV radiation in the range from 5 nm to 30 nm. Thin layers 12 comprising Mo as absorber material are applied alternately with relative "thicker" layers 13 comprising Si as spacer material. A layer pair can also contain at least one further layer, in particular an interposed barrier layer, which can consist e.g. of C, $B_4C$, $Si_xN_y$, SiC or a composition comprising one of said materials and is intended to prevent interdiffusion at the interface. It is thereby possible to ensure permanently sharply defined interfaces even under prolonged radiation loading.

The common reflective layer system 6 comprises, for example, 50 layer pairs with a total thickness of approximately 350 nm, such that the periodic stack reflects radiation incident from a common radiation entrance surface 7 of the common reflective layer system 6. Additionally, the period of the layer pairs is chosen in a manner dependent on the angle-of-incidence range that occurs and the operating wavelength such that maximum or almost maximum reflectivity occurs in accordance with the Bragg equation. The term "common radiation entrance surface" as used herein means that one single radiation entrance surface is common to a plurality or all mirror elements so that the mirror elements share the common radiation entrance surface. The radiation entrance surface 7 could be laterally subdivided in individual radiation entrance surfaces 7a, 7b of the individual mirror elements 2a, 2b as indicated in FIG. 1. The common radiation entrance surface 7 and the individual radiation entrance surfaces 7a, 7b jointly, respectively, form a mirror surface 3 of the mirror arrangement 1. Hence, each mirror element 2a, 2b comprises a layer structure including layers essentially parallel to the radiation entrance surfaces 7a, 7b.

For a given electrode diameter D and the width W of the gap region, respectively, it is possible to approximate the form of the mirror surface 3 to a desired form of the mirror surface, while not having too many electrodes 9a, 9b and thereby too many mirror elements 2a, 2b, respectively. In particular a number of mirror elements 2a, 2b over a diameter of a useful area of the mirror arrangement 1 like the mirror surface 3, e.g. in FIG. 2 further along the line AA' to the right and to the left, may be in the range from 20 to 200, for example.

The layer construction of the multilayer arrangements 5a, 5b of the individual mirror elements 2a, 2b, is designed such that the mirror arrangement 1 as a whole can be used as a wavefront correction device that is effective in a spatially resolving fashion.

The first and second electrodes 9a, 9b are connected via the wires 18a, 18b to the switchable DC voltage source, via which, as necessary, a DC voltage Va, Vb of predeterminable magnitude up to several Volts can be applied between the first electrode 9a and the common electrode 9c and/or the second electrode 9b and the common electrode 9c. A voltage difference Va–Vb between adjacent first and second electrodes 9a, 9b may be up to several Volts. In general, there is a separate switchable or continuously variably settable DC voltage source for each of the first and second electrodes 9a, 9b. Hence, each of the first and second electrodes 9a, 9b can be put at a suitable potential relative to the common electrode 9c independently of the other electrodes. Thereby, individual piezoelectric layers 8a, 8b or layer portions are permeated locally by individual first and second electric fields below the first and/or second electrodes 9a, 9b and their layer thicknesses tp in the vertical z direction changes locally in a manner dependent on the applied voltages; the individual piezoelectric layers 8a, 8b of the mirror elements 2a, 2b are adjusted with regard to their layer thicknesses individually. Hence, a layer thickness profile extending in the x-direction may be produced.

This makes use of the inverse piezoelectric effect, in which the common piezoelectric layer 8 locally deforms reversibly under the action of local electric fields. In this case, a crystalline material of the piezoelectric layer, e.g. $Pb(Zr,Ti)O_3$, does not undergo a phase transformation, rather a reversible displacement of positive and negative charge centroids within the crystal structure of the piezoelectric layer material merely takes place.

The setting range (tuning range) is primarily determined by the elasticity and the yield stress of the piezoelectric layer material. When the yield stress ($\sigma_y$) is exceeded, an irreversible deformation of the layer material commences. The yield stress is linked to the elasticity (described by the modulus of elasticity E, also called Young's modulus) of the material and the dimensional change or deformation of the material, for which the strain e serves as a normalized measure. The relationship between the dimensional change (strain) of the layer thickness which is possible without plastic deformation of the material ($\varepsilon_{max}=\Delta tp/tp$), the yield stress and the modulus of elasticity is given by $\varepsilon_{max}=\sigma_y/E$. In this case, tp is the initial layer thickness and $\Delta tp$ is the change in layer thickness. The yield stress for piezoelectric materials is typically between 1% and 5% and is approximately 4.8% for $BaTiO_3$ (R. F. Cook, C. J. Fairbanks, B. R. Lawn and Y.-W. Mai "Crack Resistance by Interfacial Bridging: Its Role in Determining Strength Characteristics," J. Mater Res., 2, 345-356 (1987)).

If the intention is then to provide location-dependent (spatially resolved) wavefront correction over the entire mirror surface 3, electrical voltages Va, Vb of different magnitudes can be applied to the piezoelectric layers 8a, 8b of the individual mirror elements 2a, 2b, such that different layer thicknesses of the piezoelectric layers 8a, 8b below the first and/or second electrodes 9a, 9b are established within the individual mirror elements 2a, 2b. In this case, the individual reflective layer systems 6a, 6b with their radiation entrance surfaces 7a, 7b can be locally raised or lowered above the first and second electrodes 9a, 9b with the aid of the piezoelectric layers 8a, 8b with respect to the individual substrates 4a, 4b and the common substrate 4, respectively. By changing relative heights of the reflective layer systems 6a, 6b of the adjacently arranged mirror elements 2a, 2b a possible unflatness or other undesired deviations of the mirror surface 3 can be compensated and a spatially resolving phase correction of the wavefront of impinging radiation is possible. In this case, the lateral resolution (spatial resolution) of the correction is dependent on the lateral dimensions of the radiation entrance surfaces 7a, 7b of the individual mirror elements 2a, 2b.

Figure 3:
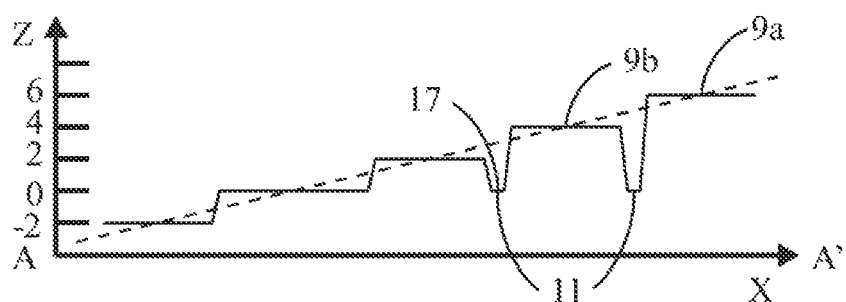
FIG. 3 shows a height profile along the line AA' in FIG. 2 for a reference mirror arrangement without an interconnection arrangement.

Without the common interconnection layer 10 parts of the piezoelectric layers 8a, 8b below the gap 11 would not be permeated by electric fields during operation and hence would not be deformed. FIG. 3 shows a z height profile in arbitrary units (a.u.) along the line AA' in FIG. 2 at the top of first and second electrodes 9a, 9b for a mirror arrangement without an interconnection arrangement. In the gap regions 11, where the piezoelectric layers 8a, 8b are not deformed, the z height of the isolator and spacer layer 17 remains on a constant level, which is z=0 in the case of the example. Beside the gap regions 11 the z height of the first and second electrodes 9a, 9b is altered by the externally controlled deformation of the corresponding piezoelectric layers 8a, 8b. Hence, there are sharp kinks, steps and trenches along the height profile. Correspondingly, the common reflective layer system 6 and the mirror surface 3, respectively, above the first and second electrodes 9a, 9b and the isolator and spacer layer 17 may exhibit sharp kinks, steps and trenches. Such kinks, steps or trenches in the common reflective layer system 6 and the mirror surface 3, respectively, may cause wavefront distortions of the reflected light.

As opposed to that, a mirror arrangement according to the embodiment comprises an interconnection arrangement, as is the case of the example of FIG. 1 in the form of the common interconnection layer 10. It covers the parts of the piezoelectric layers 8a, 8b not being covered by the first and second electrodes 9a, 9b in the gap region 11.

Figure 4:
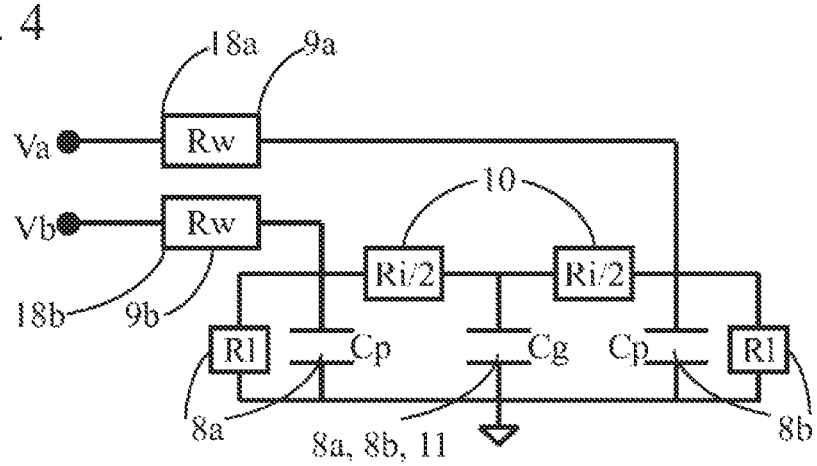
FIG. 4 shows an equivalent circuit diagram of the electrical components of the mirror arrangement of FIG. 1 with an interconnection arrangement according to an embodiment.

FIG. 4 shows an equivalent circuit diagram of the electrical components of the mirror arrangement of FIG. 1 with an interconnection arrangement as described. An electric resistance of the interconnection arrangement 10 in the gap region 11 between the first and second electrodes 9a, 9b of FIG. 1, also denoted as an "interconnection resistance" Ri, is greater than an electric resistance of the first electrode 9a plus its lead-in connection wire 18a, also denoted as an "electrode resistance" Rw, and greater than an electric resistance Rw of the second electrode 9b plus its lead-in connection wire 18b. In addition, the interconnection resistance Ri is less than the electric resistances of the piezoelectric layers 8a, 8b of the adjacent electrode arrangements comprising the first and second electrodes 9a, 9b, also denoted as "piezoelectric resistances" Rl. Typically, the metal material of the electrodes 9a, 9b, 9c and the lead-in wires 18a, 18b has a lower specific electric resistivity than the semiconductor material of the common interconnection layer 10 and the semiconductor material has a lower specific electric resistivity than a piezoelectric material of the piezoelectric layers 8a, 8b. Hence, the interconnection resistance Ri can be higher than the electrode resistance Rw and lower than the piezoelectric resistance Rl as desired.

Since the interconnection resistance Ri is greater than the electrode resistances Rw, there will be no short circuit between the first and second electrodes 9a, 9b. The first and second electrode arrangements can still be driven independently of one another and hence be kept at a suitable potential. Since the interconnection resistance Ri is less than the piezoelectric resistances Rl, electric charge provided by the first and second electrodes 9a, 9b can accumulate in the interconnection arrangement 10 and will not instantly drain off by leakage through the piezoelectric layers 8a, 8b.

The electrode resistance Rw may be less than or equal to 100 ohm ($\Omega$) in the case of the example. Hence, there should be no significant voltage drop along the first and second electrodes 9a, 9b, in particular along their lead-in connection wires 18a, 18b.

The interconnection resistance Ri may be in the range from 10 kiloohm (k$\Omega$) to 1 megaohm (M$\Omega$) in the case of the example. If the interconnection resistance is too high, a time constant $\tau c$ for accumulating charge in the common interconnection layer 10 in the gap region 11 may be too high. The time constant $\tau c$ can be estimated as $\tau c = Cg \times Ri/2$, giving $\tau c$ from 2.5 milliseconds to 0.25 seconds with $Cg=0.5$ micro Farad being the capacitance of the piezoelectric layers 8a, 8b in the gap region 11. This time constant is presently considered to be sufficiently low for the desired use of the mirror arrangement 1 as a wavefront correction device, whereby an adjustment of the applied voltages Va, Vb can be done, for example, after each wafer swap, typically every 20 seconds. Cp is the capacitance of the piezoelectric layers 8a, 8b below the first and second electrodes 9a, 9b, which may have a value comparable to the capacitance Cg. On the other hand, if the interconnection resistance Ri is too low, an electric current flow through the interconnection layer 10 between the first and second electrodes 9a, 9b caused by the applied electric voltages at the first and second 9a, 9b may cause undesired resistive heating. For a voltage difference Va-Vb of 2 V between the first and second electrodes 9a, 9b the resistive heat generation P is with $P=(Va-Vb)^2/Ri$ in the range of 4 to 400 μW (microWatts), which is presently considered to be sufficiently low for the desired use of the mirror arrangement 1. Corresponding to the dimensions of the gap region 11 a specific electric resistivity of the interconnection arrangement may be in a range of $\rho i = Ri \times ti \times W/D$ giving a value in the range from $5 \times 10^{-4}$ $\Omega m$ to $2 \times 10^{-1}$ $\Omega m$, which is typical for semiconductor materials.

The piezoelectric resistances Rl may be greater than or equal to 100 M$\Omega$ in the case of the example. Hence, leakage currents through the piezoelectric layers 8a, 8b possibly leading to a reduction of electric charge accumulated in the interconnection arrangement 10 can be suppressed.

When the first and/or second electrodes 9a, 9b are put at suitable voltages or potentials Va, Vb, there is a continuous or smooth potential or voltage transition in the common interconnection layer 10 in the gap region 11 from Va at a right boundary of the first electrode 9a in FIG. 1 to Vb at a left boundary of the second electrode 9b. Charge is accumulated in the common interconnection layer 10 causing an interconnection electric field to build up in the gap region 11 vertically in between the interconnection layer 10 in the gap region 11 and the common electrode 9c below. The interconnection electric field generates a continuous lateral transition between the first electric field at or below the first electrode 9a and the second electric field at or below the second electrode 9b.

Figure 5:
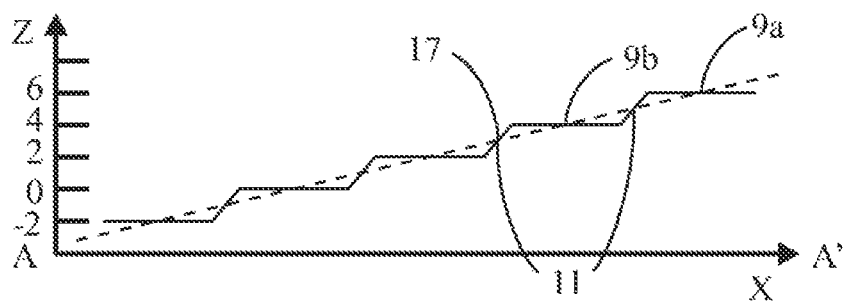
FIG. 5 shows a height profile along the line AA' in FIG. 2 for a mirror arrangement with an interconnection arrangement according to an embodiment.

FIG. 5 shows a z height profile in arbitrary units (a.u.) along the line AA' in FIG. 2 at the top of first and second electrodes 9a, 9b for a mirror arrangement with an interconnection arrangement according to an embodiment. The interconnection electric field generated by the interconnection arrangement permeates the piezoelectric layers 8a, 8b in the gap region 11. Thereby, a continuous or smooth deformation of the parts of the piezoelectric layers 8a, 8b in the gap regions 11 is caused. Overall, the common piezoelectric layer 8 is continuously deformed without any gap and its thickness profile does not have any discontinuities like steps or trenches. Correspondingly, the z height of the top of the electrodes and the isolator and spacer layer 17 is only rising from left to right in FIG. 5. Correspondingly, the common reflective layer system 6 is continuously deformed without any gap and does not have any discontinuities like steps or trenches. It is only rising from left to right in z height. Thereby, sources for wavefront errors caused by discrete first and second electrodes 9a, 9b, such as sharp kinks, steps or trenches in the reflective layer systems 6a, 6b and the mirror surface 3, are reduced. The mirror arrangement 1 is improved with respect to the prior art and has improved optical properties e.g. for an improved wavefront correction. Additionally, a risk of material fatigue and cracking of the components of the mirror elements 2a, 2b is reduced.

An additional advantage of the interconnection arrangement in form of the common interconnection layer 10 is that it may work as a shield for the piezoelectric layers 8a, 8b, especially in the gap region 11, against electric fields, e.g. caused by the lead-in connection wires 18a, 18b, from above the interconnection arrangement in the case of the example. Therefore it eliminates crosstalk that is introduced from such electric fields.

Normally the resistance of the semiconductor material of the interconnection arrangement 10 will strongly depend on temperature, while the resistance of the metal material of the electrodes 9a, 9b will be less dependent on temperature. Hence, a resistance measurement of the interconnection arrangement comprising the semiconductor material can be used to determine a local temperature distribution within the mirror arrangement 1, which may be caused by absorption of impinging radiation within the mirror arrangement 1. The resistance measurement can be performed by measuring a current flow Ii from the first electrode 9a through the interconnection arrangement 10 to the second electrode 9b and can be calculated to Ri by $Ri=(Va-Vb)/Ii$. Measuring the temperature distribution provides an estimation of a source for wavefront errors and thus may be used as a feedback-signal for the mirror arrangement 1, i.e. the individual adjustment of the particular electrical voltages Va, Vb applied to the corresponding electrode arrangements 9a, 9b, 9c.

Mirror arrangements which, with the aid of piezoelectric layers, enable a spatially resolving setting of the wavefront profile over the mirror surface of the mirror arrangement can be used for various tasks, for example in optical systems. Possible uses in the context of a projection objective for a lithography exposure apparatus are presented hereinafter.

FIG. 6 shows optical components of a lithography exposure apparatus WSC for exposing a radiation-sensitive substrate SUB arranged in the region of an image plane IS of a projection objective PO with at least one image of a pattern of a reflective patterning device or mask M arranged in the region of an object plane OS of the projection objective PO.

The apparatus WSC is operated with radiation from a primary radiation source RS. An illumination system ILL serves for receiving the radiation from the primary radiation source RS and for shaping illumination radiation directed onto the pattern. The projection objective PO serves for imaging the structure of the pattern onto the light-sensitive substrate SUB.

In the application field of EUV lithography the primary radiation source RS can be, inter alia, a laser plasma source or a gas discharge plasma source or a synchrotron-based radiation source. Such radiation sources generate a radiation RAD in the EUV range, in particular having wavelengths of between 4 nm and 30 nm. In order that the illumination system ILL and the projection objective PO can operate in this wavelength range, they are constructed with components that are reflective to EUV radiation.

The radiation RAD emerging from the radiation source RS is collected with a collector COL and directed into the illumination system ILL. In this case, the radiation passes through an intermediate focal plane, in which devices for separating undesired radiation portions can be provided. The illumination system ILL shapes the radiation RAD and thus illuminates an illumination field situated in the object plane OS of the projection objective PO or in the vicinity thereof. In this case, the form and size of the illumination field determine the form and size of the effectively used object field in the object plane IS.

A reflective reticle M or some other reflective patterning device is arranged in the object plane OS during operation of the apparatus WSC.

The projection objective PO has six mirrors M1 to M6 having curved mirror surfaces arranged along a common optical axis AX. The projection objective images the pattern of the mask, on a reducing scale, into the image plane, in which the substrate to be exposed, e.g. a semiconductor wafer, is arranged. The projection radiation PR passing from the mask M to the substrate is successively reflected at the six mirrors (first mirror M1 to sixth mirror M6). The image field IF, which is optically conjugate with respect to the object field OF, lies in the image plane. A real intermediate image IMI optically conjugate with respect to the object field and image field is formed optically between fourth mirror M4 and fifth mirror M5 geometrically near the edge of sixth mirror M6. A first pupil surface P1 exists where a chief ray crosses the optical axis AX near or at second mirror M2. A second pupil surface P2 exists geometrically about halfway between fifth and sixth mirrors M5 and M6.

All of the mirrors are covered with multilayer reflection coatings which have a reflective effect for EUV radiation and which can contain e.g. Mo/Si layer pairs (bilayer).

A device (reticle stage) for holding and manipulating the mask M (reticle) is arranged such that the pattern arranged on the mask lies in the object plane OS of the projection objective PO, which is also designated here as the reticle plane. The mask is movable in this plane for scanner operation in a scanning direction (y-direction) perpendicularly to the reference axis AX of the projection lens (z-direction) with the aid of a scan drive.

The substrate SUB to be exposed is held by a device (wafer stage) comprising a scanner drive in order to move the substrate synchronously with the mask M perpendicularly to the reference axis AX in a scanning direction (y-direction). Depending on the design of the projection lens PO, these movements of mask and substrate can be effected in a manner parallel or antiparallel with respect to one another.

The wafer stage and the reticle stage are part of a scanner device controlled with a scan control device, which, in the embodiment, is integrated into the central control device of the projection exposure apparatus.

All optical components of the projection exposure apparatus WSC are accommodated in an evacuatable housing. The projection exposure apparatus is operated under vacuum.

EUV projection exposure apparatuses having a similar basic construction are known e.g. from WO 2009/100856 A1. A projection objective having a similar basic construction is disclosed in EP 1178356 A2 (FIG. 4). The disclosures of said documents are incorporated by reference into the content of this description.

One or more of the first to sixth mirror M1 to M6 may comprise a mirror arrangement according to an embodiment described in this application. A mirror arrangement may provide different useful functionalities depending on the type of mirror and the position of the mirror along the optical path.

For example, second mirror M2 is a concave mirror positioned very near or at the first pupil surface P1 optically conjugate to a pupil surface of the illumination system ILL. Therefore, the spatial intensity distribution of radiation on this mirror will be determined by the type of illumination settings provided by the illumination system. For example, when a dipole setting is used, radiation impinging on the second mirror M2 will be concentrated in two diametrically opposite areas corresponding to the poles of the illumination setting, thereby causing uneven radiation load on the second mirror. This may cause uneven heating of the mirror, thereby causing uneven deformation and associated aberrations. The reflective mirror surface of the mirror arrangement may then be controlled such that effects of uneven radiation load may be at least partly compensated, thereby reducing imaging errors otherwise present in the system.

Although sixth mirror M6 is not positioned exactly in a pupil surface, the position is relatively close to the pupil surface, whereby an uneven radiation load may result in specific illumination settings. As in the second mirror, an adaptable mirror arrangement may at least partly compensate for aberrations which would otherwise be generated. Further, a large portion of sixth mirror M6 is optically used in operation. Specifically, sixth mirror is the mirror having the largest optically used area of all mirrors. A large mirror may be particular sensitive to influences of gravity on the mirror shape. Those influences can be compensated by controlling the overall surface shape of the mirror arrangement accordingly.

As another example, fifth mirror M5 (geometrically closest to the image surface) is a convex mirror positioned so that a large range of angles of incidence of the EUV radiation is present on the mirror surface. Also, the largest angles of incidence may occur on this mirror. Under these conditions, the reflectivity behavior of this mirror is particularly sensitive to small imperfections in the layer structure of the multilayer system. When fifth mirror is designed as a mirror arrangement according to an embodiment, it is possible to counteract at least partly problems resulting from small imperfections in layer structure.

As another example, the optically used concave reflective surface of fourth mirror M4 is positioned optically close to a field surface, specifically to the field surface where the intermediate image IMI is formed. Controlling the surface shape of a mirror close to the field surface may be utilized to compensate for field dependent aberrations.

Third mirror M3 has a convex reflective surface arranged optically in an intermediate range neither very close to a field surface nor very close to a pupil surface. Mirrors in such intermediary positions may also be provided with mirror arrangements according to an embodiment.

When the problem of wavefront correction is considered, it may also be emphasized that a typical EUV projection objective, typically has a relative small number of optical surfaces actually contributing to image formation, for example four, six or eight mirrors. Therefore, there is only a limited number of degrees of freedom for influencing the wavefront through wavefront correcting manipulators. It may therefore be useful to provide more than one mirror of a projection objective with a mirror arrangement according to an embodiment of the present application. For example, at least one mirror close to a pupil surface, at least one mirror close to a field surface and at least one mirror at an intermediate position may be designed as a mirror arrangement according to an embodiment of the invention, so that multiple degrees of freedom for a wavefront correction are provided.

As mentioned above, use of a mirror arrangement according to embodiments of the invention is not limited to optical systems for EUV lithography. For example, a mirror arrangement according to an embodiment may be utilized as a curved mirror in a catadioptric projection objective designed for wavelengths in the deep ultraviolet range, for example at about 248 nm or at about 193 nm. For example, the smooth continuous mirror surface of a mirror arrangement may have an overall concave shape so that an active concave mirror capable of adapting the surface shape of the concave mirror may be provided.

Some possible uses of mirror arrangements in a projection objective of a lithography exposure apparatus have been explained on the basis of the exemplary embodiments. Alternatively or additionally, provision can also be made for making at least one mirror of the illumination system ILL in accordance with an embodiment of a mirror arrangement. Mirrors described in WO 2012/126954 A1 may be designed according to an embodiment of the present application The total mirror surface of a mirror arrangement can be flat in the manner of a plane mirror. It is also possible to design a mirror arrangement in a convexly or concavely curved mirror surface. In the examples, the individual radiation entrance surfaces are plane surfaces in each case. This is not mandatory, however. Individual or all of the individual radiation entrance surfaces of the mirror elements can also be convexly or concavely curved. Additionally, individual mirror elements may be mounted on a carrier structure such that a desired form of the mirror surface is obtained.

The shape of the individual mirror elements can be adapted to the desired application.

The layer construction of the multilayer arrangement in the region of the successive layer pairs can be adapted to the application striven for. In the exemplary embodiment, the piezoelectric layer is arranged between the plurality of layer pairs of the reflective layer system and the substrate, comparable to the example of FIG. 9 of WO 2012/126954 A1. The layer construction of the multilayer arrangements of the individual mirror elements is designed such that the mirror arrangement as a whole can be used as a wavefront correction device that is effective in a spatially resolving fashion, without different spatial distributions of the reflectivity arising for different operating modes.

Alternatively, the piezoelectric layer may be positioned between a first group of layer pairs remote from the substrate and a second group of layer pairs near the substrate, comparable to the example of FIG. 1 of WO 2012/126954 A1. Correspondingly, the interconnection arrangement may be positioned in order to be able to provide the interconnection field to the piezoelectric layer. With the interposed piezoelectric layer, the distance between the layer groups (measured perpendicularly to the radiation entrance surface) can be altered by applying an external voltage. The interposed piezoelectric layer introduces an optical path length difference or a phase shift between the portions of radiation reflected at the first layer group and the portions of radiation reflected at the second layer group. By applying the external voltage, it is possible for the extent of the phase shift to be varied in a continuously variable manner, thereby changing the reflectivity of the corresponding mirror element. The piezoelectric layer integrated between the first and second layer groups acts in the manner of an integrated Fabry-Perot interferometer (etalons) with an electrically adjustable distance between its interfaces having a reflective effect.

In multilayer arrangements having a piezoelectric layer and an interconnection arrangements positioned between a first group of layer pairs remote from the substrate and a second group of layer pairs near the substrate, consideration should be given particularly to ensuring that the interconnection arrangement material has low absorptions for the used radiation.

A multilayer arrangement can also have more than one piezoelectric layer which is arranged between two adjacent layer groups having a plurality of layer pairs and which serves for the controllable phase shift between the reflected portions of radiation of these layer groups. By way of example, two or three of such piezoelectric layers can be provided, between which layer groups having a plurality of layer pairs are then likewise situated, comparable to the example of FIG. 8 of WO 2012/126954 A1. Correspondingly, the multilayer arrangement can have more than one interconnection arrangements in order to be able to provide each piezoelectric layer with an interconnection field.

The multilayer arrangement may have a plurality of piezoelectric layers, such that a variation of the period thickness within the reflective layer system is possible. Since, for a given operating wavelength and a given angle of incidence, only specific layer periods lead to full constructive interference and hence to a maximum degree of reflection, by varying the period thickness it is possible to alter the reflectivity of the reflective layer system of the mirror element at the operating wavelength in a continuously variable manner. Furthermore, the phase of the reflected radiation is influenced, such that a spatially resolving wavefront influencing is also possible.

If high maximum reflectivities are required for a relatively small angle-of-incidence range, then a fully periodic sequence of layer pairs can be advantageous. If, by contrast, a broadband configuration in the angle space and/or a spectral broadband configuration are/is desired, layer pairs with different periods can also be combined (cf. e.g. DE 101 55 711 B4 or WO 2010/118928 A1). In order to reduce the dependence of the reflectivity on the angle of incidence, the layer arrangement can, in principle, also be constructed in other ways. In particular, different material pairings can be provided for the layer pairs of a multilayer arrangement. In this configuration, by applying an electric field to the piezoelectric layers, it is possible to produce an, if appropriate continuously variable, variation of the layer period within the multilayer arrangement.

The detuning or changing of the layer period can also be used to adapt the reflectivity to a central wavelength possibly deviating from the desired value, such that e.g. a compensation of variations of the source spectrum or of the spectral transmission of the overall optical system can be carried out. Alternatively or additionally, adaption to desirably or undesirably altered angles of incidence on the mirror is also possible.

For further possibilities concerning layer structures of multilayer arrangements, in particular the reflective layer system and the piezoelectric layer, reference is made to the content of WO 2012/126954 A1. The respective disclosure is incorporated herein by reference.

Embodiments of the invention can be used not just in optical systems for lithography. By way of example, use in the field of X-ray microscopy is possible, particularly in the field of EUV mask metrology. Embodiments could be used in systems for monitoring EUV aerial images, e.g. as disclosed in the international publications WO 2011/012267 A1 and WO 2011/012266 A1. Applications in EUV system metrology are likewise conceivable. Applications in the field of EUV astronomy and for optical assemblies in synchrotron systems are furthermore conceivable.

In the exemplary embodiment, the reflective layer system is adapted for reflecting EUV radiation. Alternatively or in addition, the reflective layer system may be adapted for reflecting DUV or VUV electromagnetic radiation. Alternatively to the plurality of layer pairs the reflective layer system may comprise a dielectric enhanced aluminum mirror layer for this purpose.

In the case of the example several layers or components of the multilayer arrangements of the individual mirror elements form common layers or components. In particular, the substrates of the individual mirror elements form a common substrate. Additionally, the individual mirror elements share a common electrode opposite to the first and second electrodes, a common piezoelectric layer and a common reflective layer system. Alternatively, the mirror elements may be separated, i.e. have separated substrates, separate electrodes on both opposite sides of the piezoelectric layers, separated piezoelectric layers and/or separated reflective layer systems. The mirror elements may be mirror elements that can be mounted separately from one another and, if appropriate, in a manner separated by interspaces on a carrier structure.

In the case of separated electrodes on both opposite sides of the piezoelectric layers there will be gap regions on both sides. Hence, the interconnection arrangement can comprise interconnection layers on both opposite sides of the piezoelectric layers in order to provide them with interconnection fields. Alternative to the shown common interconnection layer extending beyond the boundaries of the first and second electrodes above them, the interconnection arrangement may comprise interconnection layers interconnecting the first and second electrodes by starting from the boundaries of the first electrodes and ending at the boundaries of the second electrodes.

What is claimed is:

1. A mirror arrangement for a lithography exposure apparatus comprising:
a plurality of mirror elements adjacently arranged and jointly forming a mirror surface of the mirror arrangement,
wherein each of the mirror elements comprises a respective substrate and a respective multilayer arrangement on the respective substrate,
wherein the respective multilayer arrangements include respective reflective layer systems having respective radiation entrance surfaces forming respective portions of the mirror surface and respective piezoelectric layers are arranged between the radiation entrance surfaces and the respective substrates,
wherein each of the mirror elements comprises a respective electrode arrangement associated with the respective piezoelectric layers configured to generate an electric field, wherein layer thicknesses of the piezoelectric layers are controlled by the electric field,
wherein an interconnection arrangement electrically interconnects adjacent first and second electrodes of adjacent electrode arrangements, such that an interconnection electric field is generated in a gap region between the first and second electrodes,
wherein an electric resistance of the interconnection arrangement in the gap region between the first and second electrodes is greater than an electric resistance of the first and second electrodes and less than an electric resistance of the piezoelectric layers of the adjacent electrode arrangements with the first and second electrodes, and
wherein the interconnection electric field generates a continuous transition between a first electric field at the first electrode and a second electric field at the second electrode.

2. The mirror arrangement according to claim 1, wherein the interconnection arrangement comprises a common interconnection layer interconnecting multiple ones or all of the mirror elements.

3. The mirror arrangement according to claim 1, wherein the piezoelectric layers of multiple ones or all of the mirror elements form a common piezoelectric layer.

4. The mirror arrangement according to claim 1, wherein the reflective layer systems of multiple ones or all of the mirror elements form a common reflective layer system.

5. The mirror arrangement according to claim 1, wherein the reflective layer system is configured to reflect electromagnetic radiation in a wavelength range below 300 nanometers.

6. The mirror arrangement according to claim 1, wherein the reflective layer system comprises a plurality of layer pairs having alternating layers of a high refractive index layer material and a low refractive index layer material.

7. The mirror arrangement according to claim 1, wherein a thickness of a given interconnection layer of the interconnection arrangement is in a range from 50 nanometers to 500 nanometers.

8. The mirror arrangement according to claim 1, wherein a maximum electrode diameter of the first and second electrodes is in a range from 0.5 to 50 millimeters.

9. The mirror arrangement according to claim 1, wherein a width of the gap region between the first and second electrodes is in a range from 10 μm to 1 millimeters.

10. The mirror arrangement according to claim 1, wherein a number of the mirror elements over a diameter of a used area of the mirror arrangement is in a range from 20 to 200.

11. An optical system comprising at least one mirror arrangement according to claim 1.

12. The optical system according to claim 11, configured as a projection objective of a lithography exposure apparatus.

13. The mirror arrangement according to claim 1, wherein the respective substrates of multiple ones or all of the mirror elements form a common substrate.

14. A mirror arrangement for a lithography exposure system comprising:

a plurality of mirror elements adjacently arranged and jointly forming a mirror surface of the mirror arrangement,
  wherein each of the mirror elements comprises a respective substrate and a respective multilayer arrangement on the respective substrate,
  wherein the respective multilayer arrangements include respective reflective layer systems having respective radiation entrance surfaces forming respective portions of the mirror surface and respective piezoelectric layers are arranged between the radiation entrance surfaces and the respective substrates,
  wherein each of the mirror elements comprises a respective electrode arrangement associated with the respective piezoelectric layers configured to generate an electric field, wherein layer thicknesses of the piezoelectric layers are controlled by the electric field,
    wherein an interconnection arrangement electrically interconnects adjacent first and second electrodes of adjacent electrode arrangements, and
    wherein an electric resistance of the interconnection arrangement in a gap region between the first and second electrodes is greater than an electric resistance of the first and second electrodes and less than an electric resistance of the piezoelectric layers of the adjacent electrode arrangements with the first and second electrodes.

15. The mirror arrangement according to claim 14, wherein the electric resistance of the interconnection arrangement in the gap region between the first and second electrodes is in a range from 1 kiloohm to 10 megaohm.

16. The mirror arrangement according to claim 14, wherein the interconnection arrangement comprises a semiconductor material.

17. The mirror arrangement according to claim 14, wherein the electric resistance of the first and second electrodes is less than or equal to 1 kiloohm.

18. The mirror arrangement according to claim 14, wherein the electric resistance of the piezoelectric layers of the adjacent electrode arrangements with the first and second electrodes is greater than or equal to 10 megaohm.

19. An optical system comprising at least one mirror arrangement according to claim 14.

* * * * *

UNITED STATES PATENT AND TRADEMARK OFFICE
CERTIFICATE OF CORRECTION

PATENT NO. : 10,684,466 B2
APPLICATION NO. : 15/872974
DATED : June 16, 2020
INVENTOR(S) : Wouter Bernardus Johannes Hakvoort et al.

Page 1 of 1

It is certified that error appears in the above-identified patent and that said Letters Patent is hereby corrected as shown below:

In the Specification

In Column 6, Line 16, delete "$Co_{0.203}$;" and insert -- $Co_{0.2}O_3$; --, therefor.

In Column 6, Line 17, delete "$MnO_3$" and insert -- $MnO_3$. --, therefor.

In Column 9, Line 5, delete "apparatus" and insert -- apparatus. --, therefor.

In Column 9, Line 52, delete "manner" and insert -- manner. --, therefor.

Signed and Sealed this
Ninth Day of March, 2021

Drew Hirshfeld
*Performing the Functions and Duties of the*
*Under Secretary of Commerce for Intellectual Property and*
*Director of the United States Patent and Trademark Office*